United States Patent [19]

Varshney

[11] Patent Number: 4,493,060
[45] Date of Patent: Jan. 8, 1985

[54] SERIAL-PARALLEL-SERIAL CHARGED COUPLED DEVICE MEMORY AND A METHOD OF TRANSFERRING CHARGE THEREIN

[75] Inventor: Ramesh C. Varshney, San Jose, Calif.

[73] Assignee: Fairchild Camera & Instrument Corporation, Mountain View, Calif.

[21] Appl. No.: 543,228

[22] Filed: Oct. 20, 1983

Related U.S. Application Data

[63] Continuation of Ser. No. 241,780, Mar. 9, 1981, abandoned.

[51] Int. Cl.³ .............................................. G11C 11/34
[52] U.S. Cl. ..................................... 365/238; 365/183
[58] Field of Search ....................... 365/183, 219, 238; 357/24; 377/61, 62, 63

[56] References Cited

U.S. PATENT DOCUMENTS

| | | | |
|---|---|---|---|
| 4,165,541 | 8/1979 | Varshney et al. | 365/219 |
| 4,199,691 | 4/1980 | Angle | 365/183 |
| 4,211,936 | 7/1980 | Kosonocky et al. | 365/183 |
| 4,288,864 | 9/1981 | Harroun et al. | 365/238 |
| 4,306,160 | 12/1981 | Hamilton | 365/183 |
| 4,382,193 | 5/1983 | Grueter | 365/183 |

FOREIGN PATENT DOCUMENTS 2842285  1/1980  Fed. Rep. of Germany ...... 365/238

OTHER PUBLICATIONS

IBM Technical Disclosure Bulletin-vol. 25, No. 11B, Apr. 1983, pp. 6172-6174.

Primary Examiner—James W. Moffitt
Attorney, Agent, or Firm—Kenneth Olsen; Henry K. Woodward; Carl Silverman

[57] ABSTRACT

An SPS CCD memory using two phase clocking in the serial registers and ripple clocking in the parallel registers with interlacing transfer of charge in the parallel registers to the output serial registers. First alternate parallel registers are coupled to the output register through first transfer gates and first storage gates, and second alternate parallel registers are coupled to the output register through second transfer gates and second storage gates. Third storage gates are provided with each third storage gate alternately receiving charge from a first storage gate and a second storage gate with the third gate delivering the charge to the same storage element of the output register. By linearly staggering the endmost gates of the first alternate parallel registers and the second alternate parallel registers, the interlacing of charge occurs at the endmost gate of the parallel registers.

2 Claims, 23 Drawing Figures

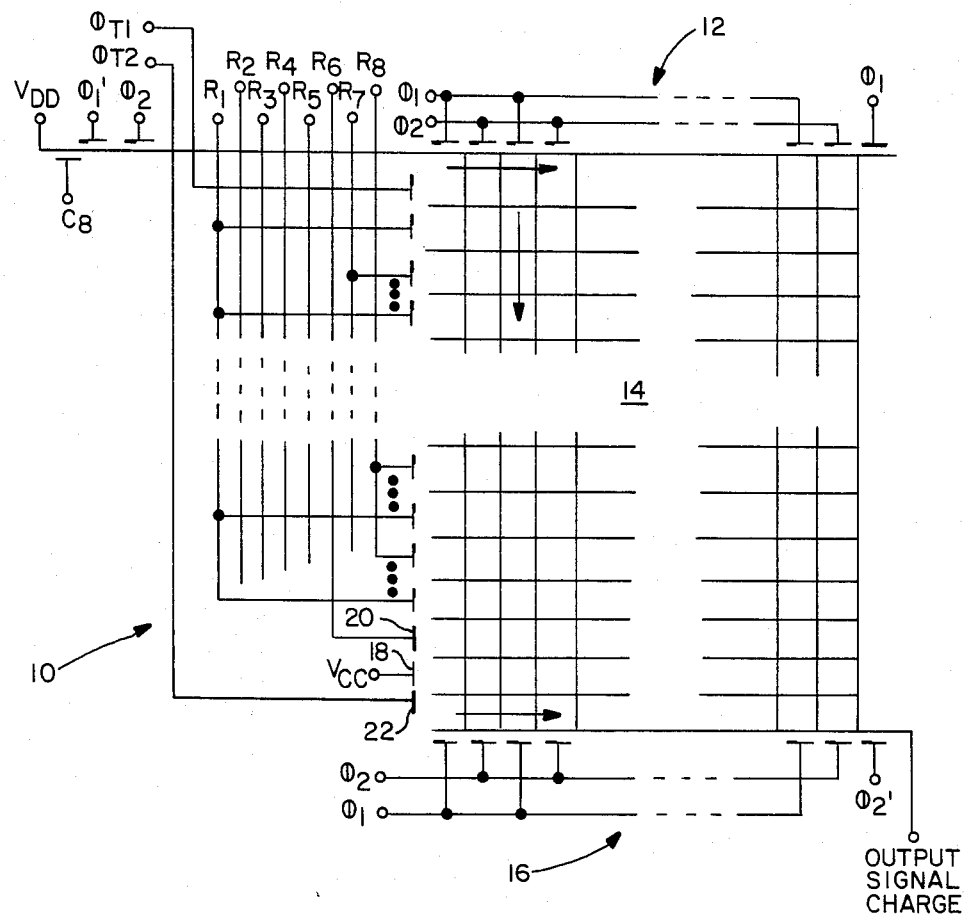
FIG.—1 (PRIOR ART)
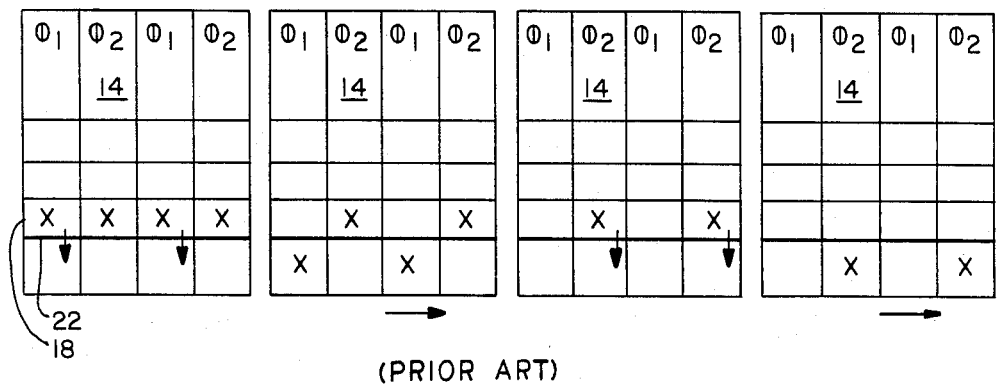
(PRIOR ART)
FIG.—2A  FIG.—2B  FIG.—2C  FIG.—2D

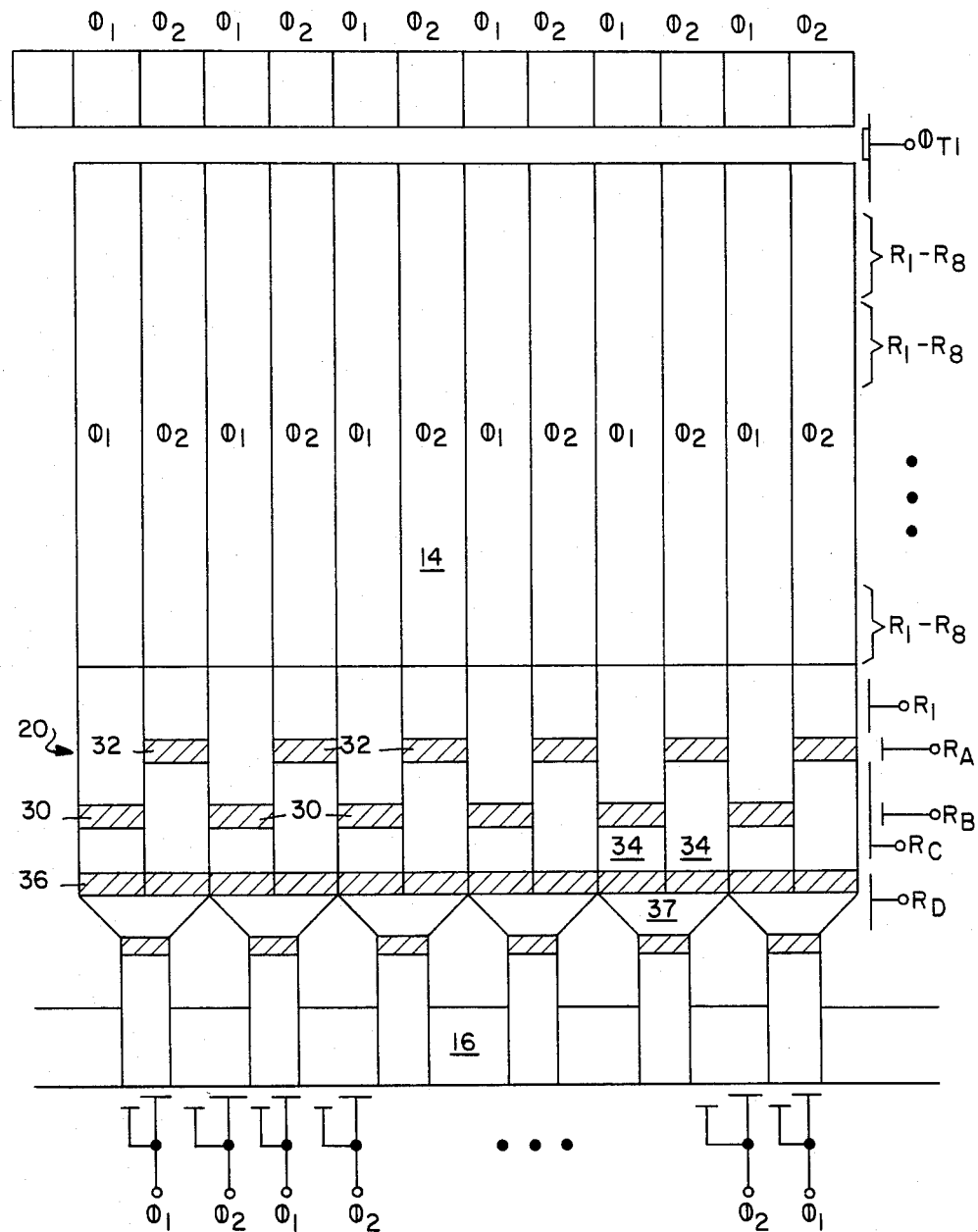
FIG.—3

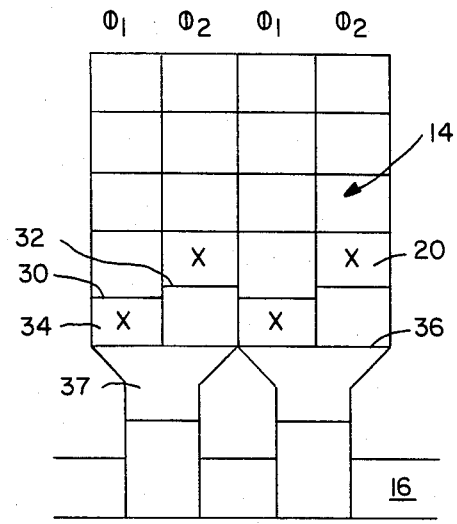
FIG.—4A
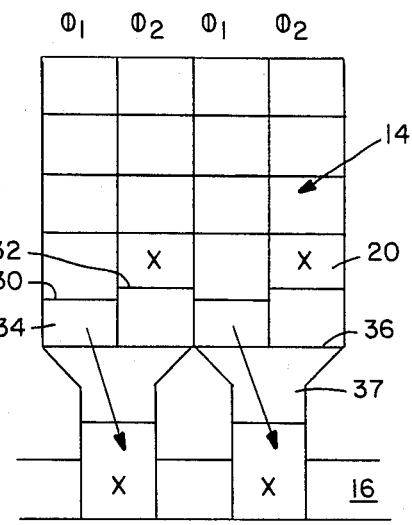
FIG.—4B
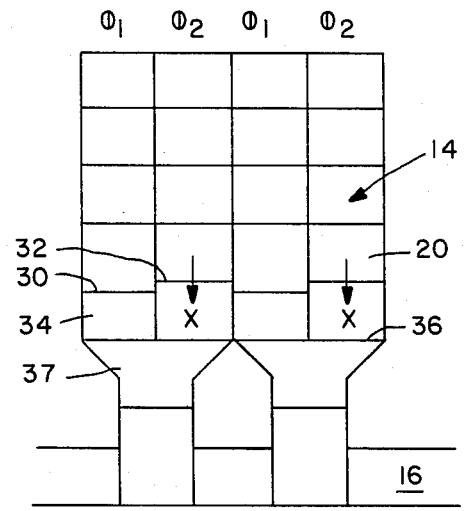
FIG.—4C
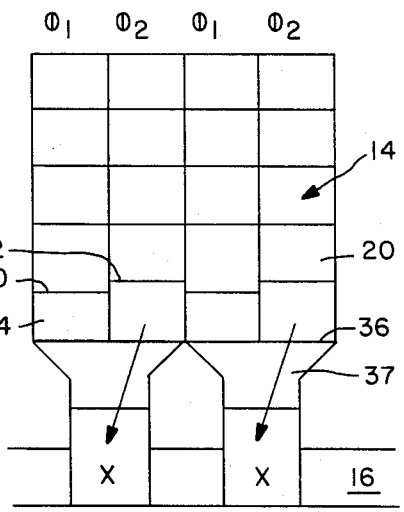
FIG.—4D
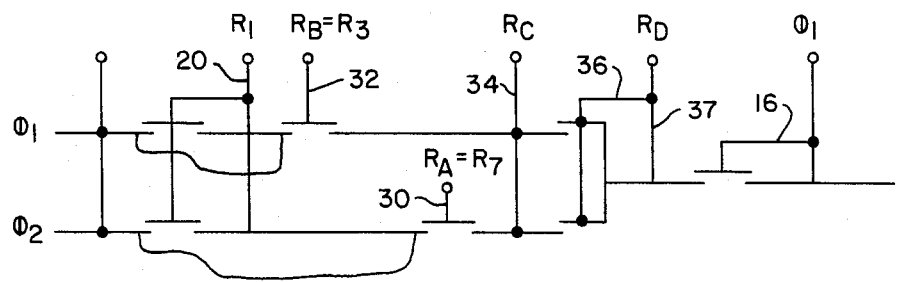
FIG.—7

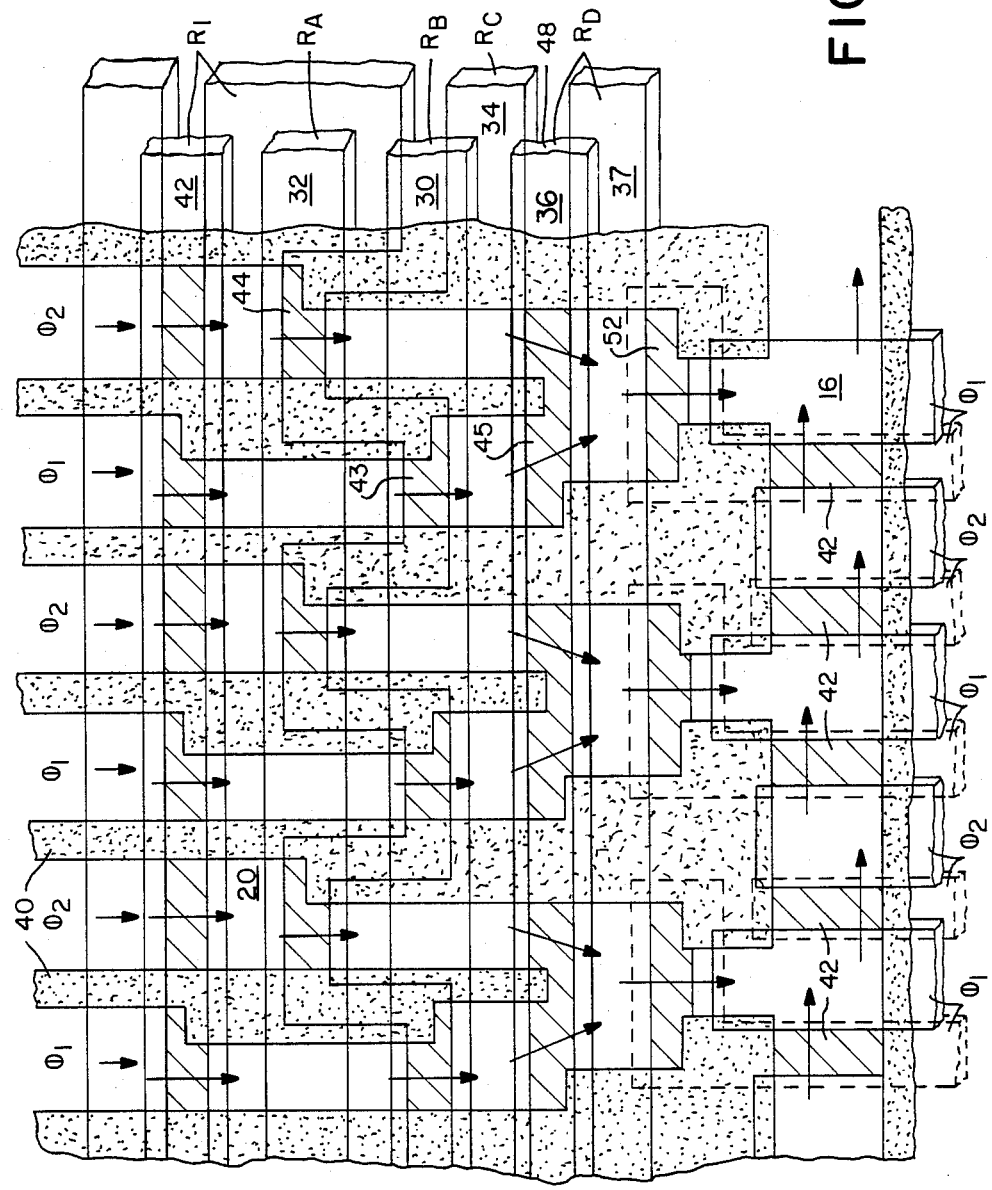
FIG.—5

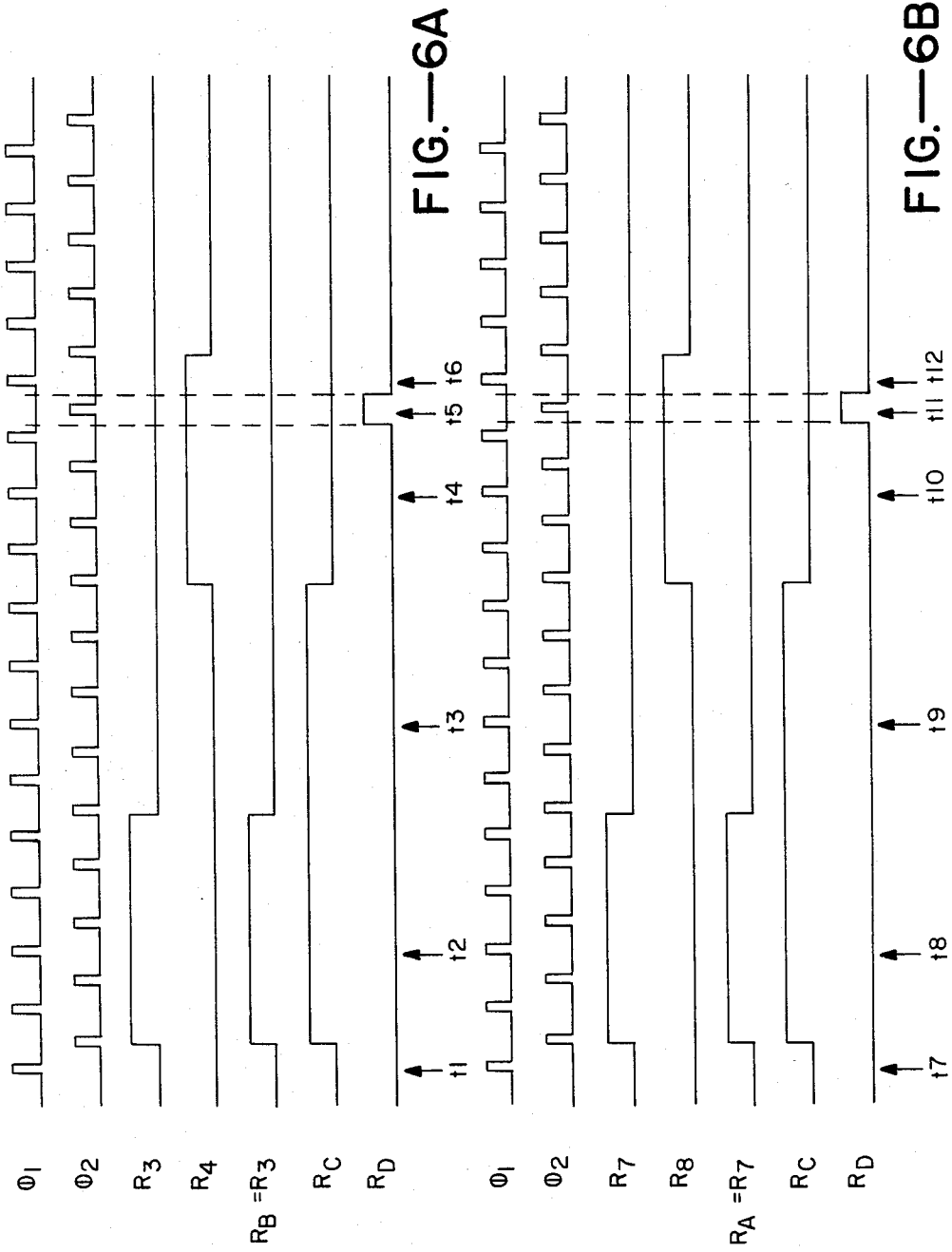

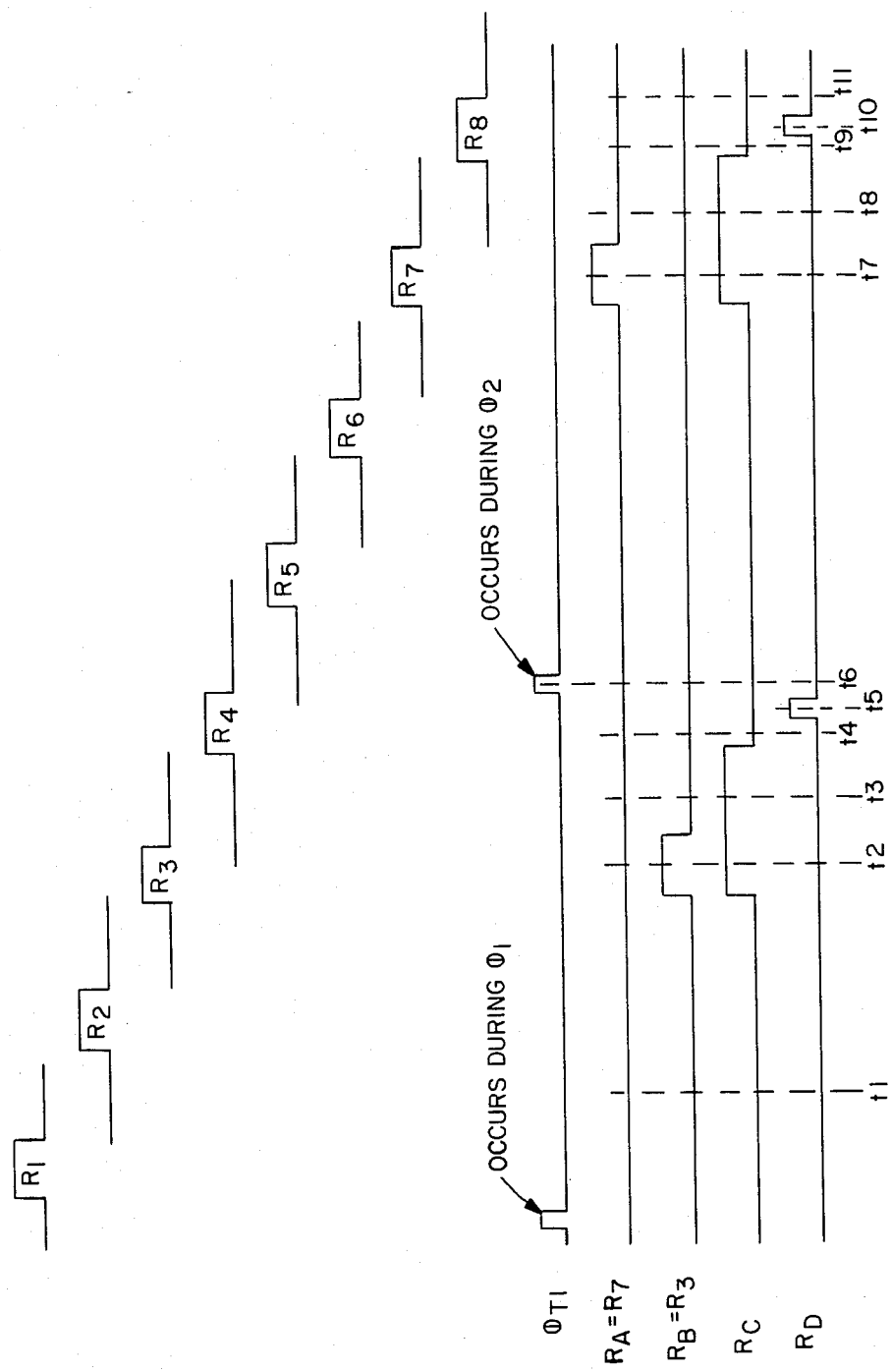

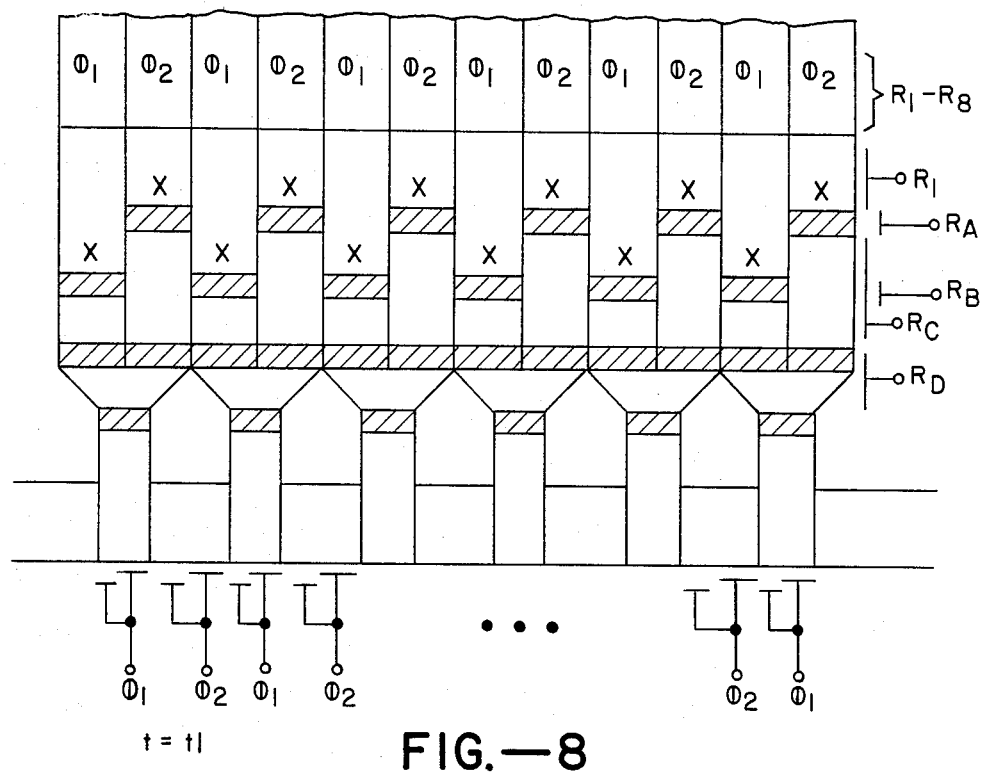
FIG.—8
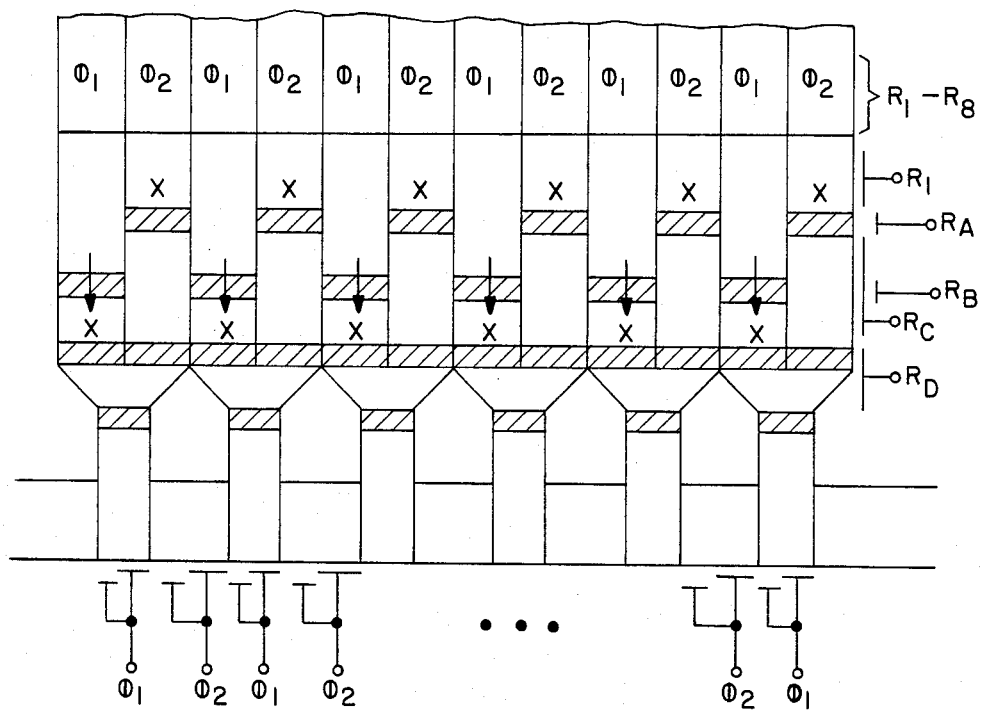
FIG.—9

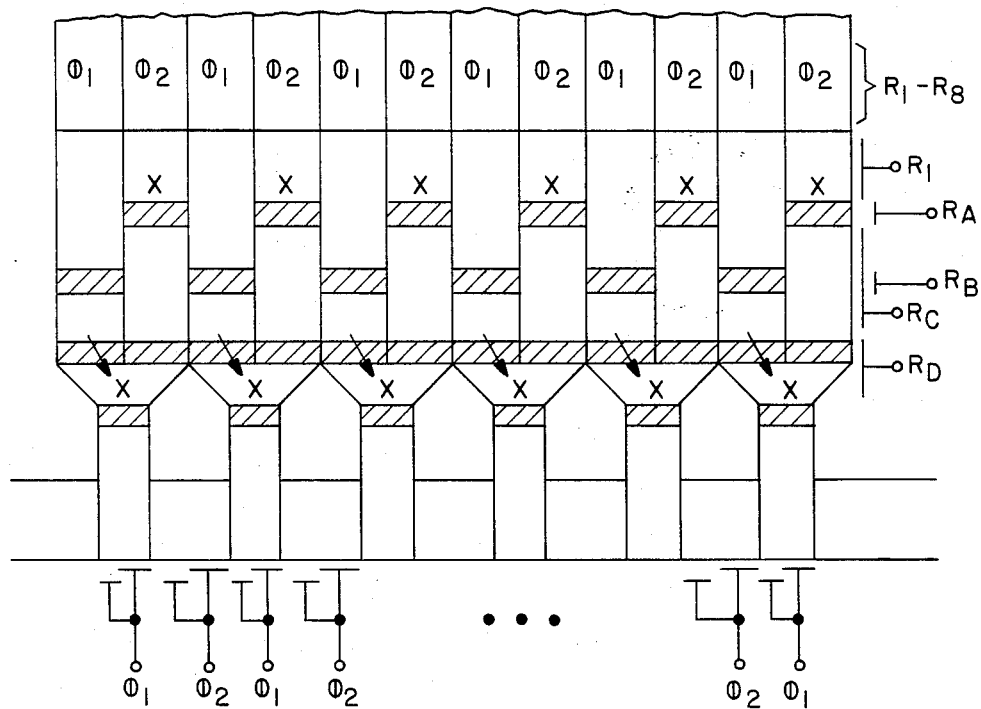
t = t5  FIG.—10
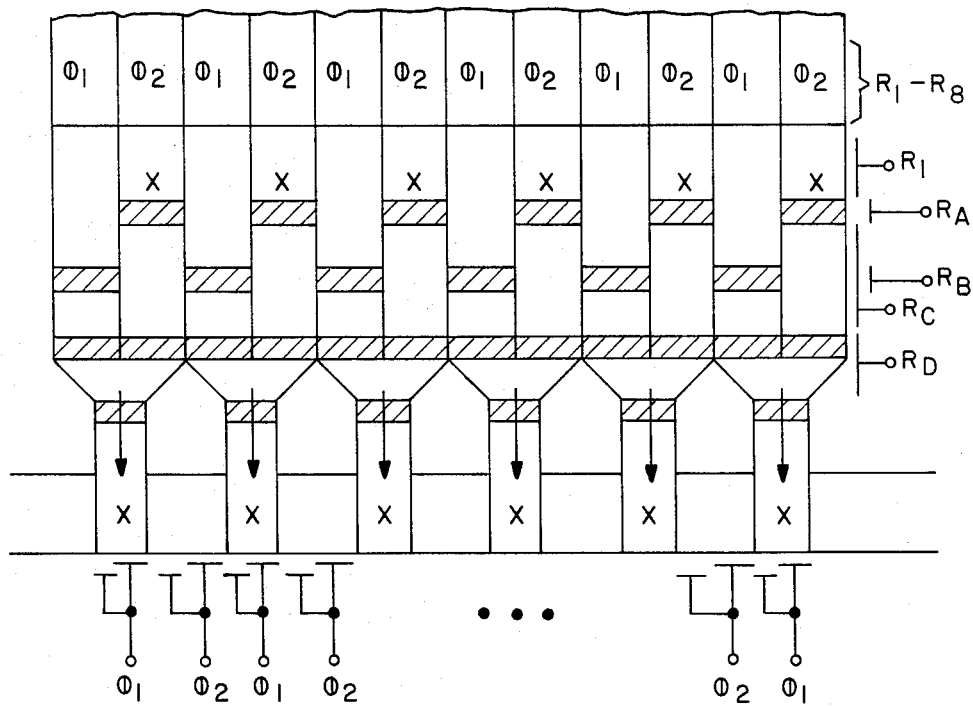
t = t6  FIG.—11

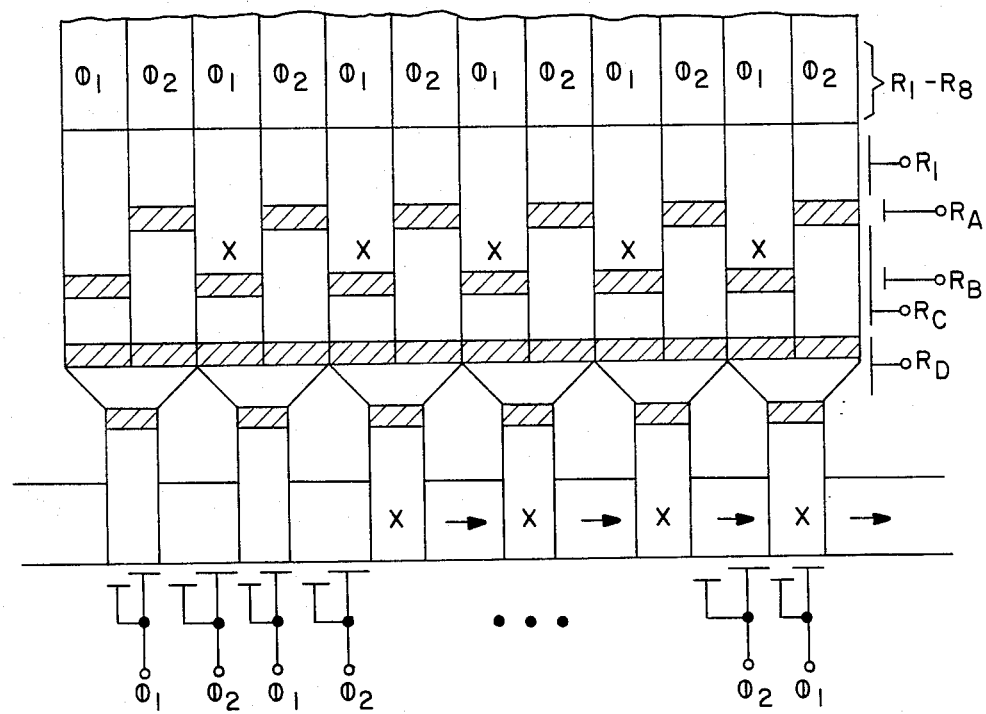
t = t7    FIG.—12
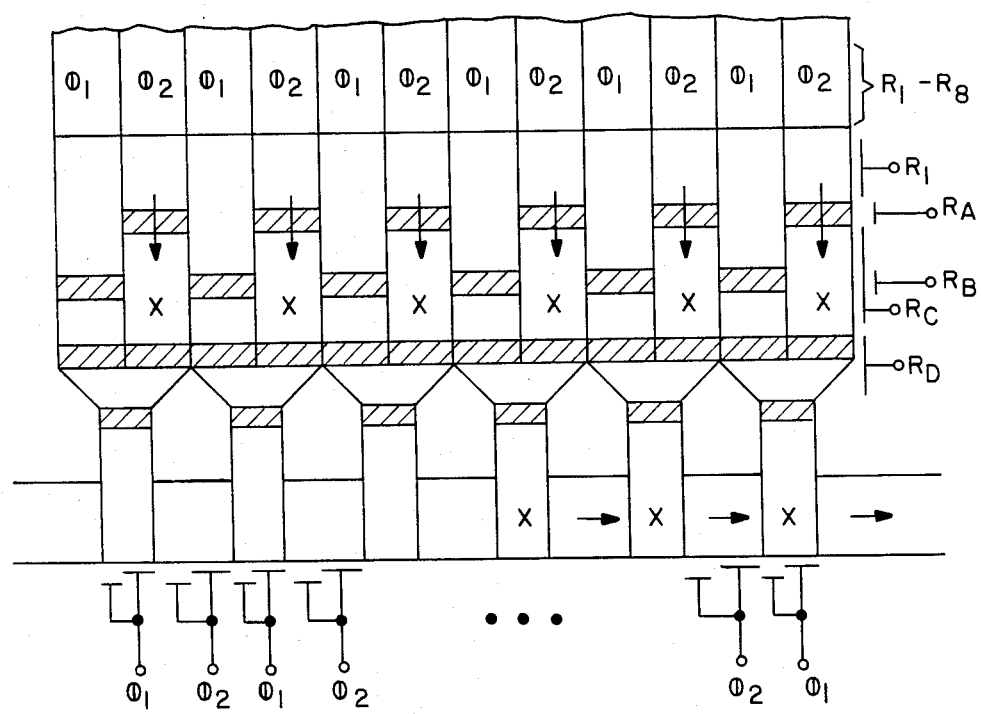
t = t8, t9, t10    FIG.—13

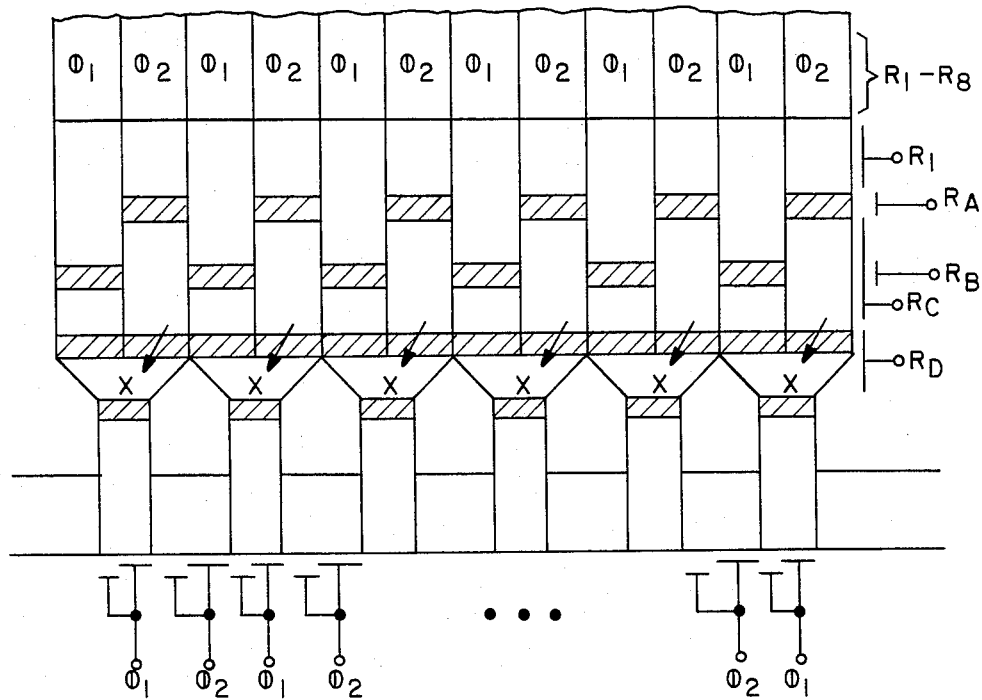
t = t11
FIG.—14
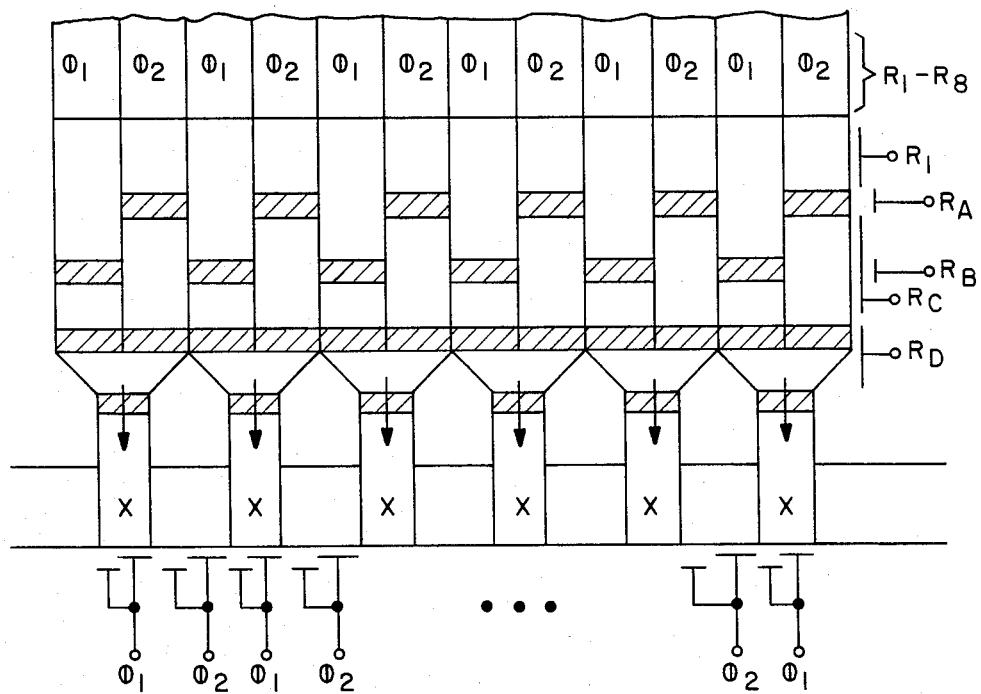
t = t12
FIG.—15

SERIAL-PARALLEL-SERIAL CHARGED COUPLED DEVICE MEMORY AND A METHOD OF TRANSFERRING CHARGE THEREIN

This application is a continuation of application Ser. No. 241,780, filed 3/9/81 now abandoned.

This invention relates generally to charge coupled devices (CCD's), and more particularly the invention relates to CCD memories employing a serial-parallel-serial (SPS) arrangement.

A two phase serial-parallel-serial charge couple device memory (SPS CCD) is disclosed by Varshney, Venkateswaran, and Amelio in U.S. Pat. No. 4,165,541. The memory has a group of parallel shift registers with an input serial shift register at one end of the group and an output serial shift register at the opposite end of the group. Data are supplied to the input serial register at the rate of the two phase clock signals, and after the register is filled a serial to parallel transfer operation loads the data in the parallel shift registers. The data transfer through the parallel shift registers, using ripple clocking, and a parallel to serial transfer operation then loads the data in the output serial shift register.

The memory uses a conventional interlacing technique in which one parallel shift register is provided for each element of the input or output serial shift registers. Using the two phase electrode structure for the input and output registers the data are transferred to or from the parallel registers at the correct phase so that charges are alternately transferred to or from alternate parallel registers.

Heretofore, transfer of charge from the parallel registers to the output serial register has required an intermediate voltage level applied to the last storage gate. This intermediate voltage level ensures that the data in alternate parallel channels are transferred to the serial gates which are at a high potential (e.g. either $\phi_1$ or $\phi_2$), and the data from other alternate parallel channels are not transferred due to the intermediate voltage level at the last storage gates being higher than the potential of the serial gates where charge transfer is not wanted. Not only is the intermediate voltage level required, but timing is critical since charge from the parallel registers is transferred and interlaced directly into the fast transfer operation of the serial register.

An object of the present invention is an improved SPS CCD memory.

Another object of the invention is an SPS CCD memory structure which simplifies transfer of charge from the parallel registers to the serial output register.

Still another object of the invention is a method of transferring charge in an SPS CCD memory without the requirement for critical timing.

Yet another object of the invention is a method of transferring interlaced data without the requirement for intermediate voltage levels.

Briefly, in accordance with the invention a two phase SPS CCD memory array includes means for transferring charge from parallel regsiters to a serial output register comprising a first transfer gate associated with each of first alternate parallel registers, a second transfer gate associated with each of second alternate parallel registers, a first storage gate of parallel registers associated with each first transfer gate, and a second storage gate of parallel registers associated with each second transfer gate. Means control the first transfer gates and the second transfer gates whereby charge from the first alternate parallel registers is transferred through the first storage gates to the serial output register and then charge from the second alternate parallel registers is transferred through the second storage gates to the serial output register.

In accordance with one feature of the invention the first and second transfer gates are linearly offset to prevent concurrent charge transfer from the first alternate parallel registers and the second alternate parallel registers.

A third storage gate means is provided for receiving charge from the first storage gates and the second storage gates and transferring the charge to the output serial register. By transferring the charge from the first alternate parallel registers to first storage gates and then transferring charge from the second alternate parallel registers to second gates, the interlacing of data from the parallel registers to the serial output register occurs before the charge is loaded in the output register. In addition, the transfer gates and storage gates obviate the need for intermediate voltage levels in transferring the charge.

The invention and objects and features thereof will be more readily apparent from the following detailed description and appended claims when taken with the drawing, in which:

FIG. 1 is a schematic of a prior art SPS CCD array.

FIGS. 2A–2D are illustrations of charge transfer in the array of FIG. 1.

FIG. 3 is a schematic of one embodiment of an SPS CCD array in which the present invention can be employed.

FIGS. 4A–4D are illustrations of charge transfer in the array of FIG. 3.

FIG. 5 is a more detailed schematic of a portion of the SPS CCD array of FIG. 3 in accordance with one embodiment of the present invention.

FIGS. 6A–6C are a timing diagram for the charge transfer in the array of FIG. 3.

FIG. 7 is an electrical schematic of two adjacent parallel channels of the SPS CCD array of FIG. 5.

FIGS. 8–15 illustrate the transfer of charge in accordance with the timing diagram of FIG. 7.

Referring now to the drawings, FIG. 1 is a schematic of an SPS CCD array as disclosed in U.S. Pat. No. 4,165,541. The CCD memory array 10 is arranged as a serial-parallel-serial memory and includes interlacing of data to and from the parallel registers and ripple clocking of the parallel shift registers to increase the bit storage capacity. A parallel shift register of the block shown includes nine groups of eight electrodes, to which ripple clock signals $R_1$, $R_2$ . . . $R_8$, respectively, are applied, each group being capable of storing seven bits of information. An input serial register 12 includes 32 electrodes associated with each of the $\phi_1$ and $\phi_2$ clock signals for a total of 64 electrodes.

In operation, data are supplied to serial input shift register 12 which is driven by clock signals $\phi_1$ and $\phi_2$. The data are stepped across the serial shift register in a conventional two phase CCD manner. As soon as the serial shift register is filled with one bit stored beneath every other electrode, a signal $\phi_{TI}$ is supplied to allow these bits of information, represented by charge packets stored beneath the serial register electrodes, to be transferred into the input electrode of every other parallel shift register 14. Then, additional data are stepped into the serial shift register by application of signals $\phi_1$ and $\phi_2$. Once the data are stored under every other electrode in the input serial shift register, this time residing under electrodes not used in the previous transfer, signal $\phi_{T1}$ is again supplied to allow the charges under the electrodes to be transferred into the input element of the remaining unused alternate parallel shift registers. Once this is complete, ripple clock signals $R_1, R_2 \ldots R_8$ are applied to the groups of elements of the parallel shift registers to transfer the data along the parallel registers. When the input electrode of each of the parallel shift registers is vacant, new data from the input serial shift register are transferred and the process is repeated.

The application of the ripple clock signals results in the rippling movement of 64 bits of data in the parallel shift registers. That is, a blank potential well is moved backward in each group of eight electrodes of the parallel shift registers, thereby transferring the data forward one electrode for each eight electrodes that the blank moves backward.

Signal $\phi_{T2}$ is applied to cause a transfer of the data from the output electrode of every other one of the 64 parallel shift registers to be transferred into corresponding alternating electrodes of the output serial shift register. These data are then stepped out of the output serial register by the application of signals $\phi_1$ and $\phi_2$. As soon as the output serial register is vacant, another transfer from the parallel shift register is initiated.

To perform the charge transfer from alternate parallel registers 14 to the output serial register 16, an additional gate 18, is provided. Signal $V_{cc}$ is applied to electrode 18 to provide an intermediate voltage level between the high level of $\phi_1$ (or $\phi_2$) and the low level of $\phi_2$ (or $\phi_1$) to selectively block charge transfer to the low level clock $\phi_2$ (or $\phi_1$).

FIGS. 2A–2D illustrate charge transfer from the parallel registers 14 to the output serial register 16 of the array of FIG. 1. In FIG. 2A the stored charge, designated by x's, under the $V_{cc}$ electrodes 18 of the parallel registers are aligned awaiting transfer. In FIG. 2B the charges in the $\phi_1$ registers are transferred to the output serial register 16 through the transfer gates 22 when $\phi_1$ is high and $\phi_2$ is low. As above described, the $V_{cc}$ voltage on electrodes 18 prevents the transfer of charge to the low $\phi_2$ electrodes of output register 16. After the $\phi_1$ charges are removed from the output register, the $\phi_2$ charges under the electrodes 18 is then transferred to the serial register 16 while $\phi_2$ is high and $\phi_1$ is low as shown in FIG. 2C. In FIG. 2D the transferred charge is loaded in the output register and ready for transfer from the array.

FIG. 3 is a schematic of one embodiment of an SPS CCD array in which the present invention can be employed. The array is similar to the array of FIG. 1 and the same reference numerals are used for like elements. However, the endmost electrodes 20 of the parallel registers 14 are linearly offset with transfer gates 30 for transferring charge from the $\phi_1$ columns to the output register being closer to the output register than the transfer gates 32 which transfer charge from the $\phi_2$ columns of the parallel registers to the output register 16. As will be described further hereinbelow, the transfer gates 30 respond to a signal $R_B$, and the transfer gates 32 respond to a signal $R_A$ whereby charge from the $\phi_1$ and $\phi_2$ columns are selectively transferred through storage gates 34 and transfer gates 36 to the storage gates 37. The storage gates 34 are controlled by a signal $R_C$ and the transfer and storage gates 36 and 37 are controlled by a signal $R_D$. Transfer to the storage gates of the output serial register 16 is controlled by the serial gate $\phi_1$. Importantly, the interlacing of data from the parallel registers to the serial output register occurs at the endmost electrodes of the parallel registers and not at the output serial register. Further, the requirement for an intermediate voltage $V_{cc}$ is obviated due to the staggered alignment of the endmost electrodes 20 of the parallel registers. Since charge is transferred to the serial register 16 from storage electrodes 37 in response to the serial register $\phi_1$ clock, critical timing is not required.

FIGS. 4A–4D illustrate the transfer of charge from the parallel registers to the output serial register in the array of FIG. 3. As illustrated in FIG. 4A the charge in the $\phi_1$ parallel registers is offset from the charge in the $\phi_2$ registers due to charge in the $\phi_1$ columns residing under storage gates 34 and charge in the $\phi_2$ columns being under electrodes 20. In FIG. 4B, charge in the $\phi_1$ columns is transferred from the storage gates 37 to the $\phi_1$ electrodes of the output register 16. After this charge is moved from the output register, the charge in the $\phi_2$ columns is transferred through the storage electrodes 37 to the serial register 16. This charge could be transferred to the $\phi_2$ electrodes of register 16, by separate storage gates, but by sharing the storage gates 37 the charge can be transferred to the $\phi_1$ electrodes, as will be described with reference to FIG. 5. After the charge is transferred to the register 16, as shown in FIG. 4D, the charge can be removed from the output register by the two phase clocking. Importantly, the intermediate voltage $V_{cc}$ is eliminated and the interlacing of the charge occurs in the slow transfer region of the parallel registers rather than at the fast transfer regions of the output serial register 16. Further, critical timing in the charge transfer to the serial output register is eliminated by using the serial register $\phi_1$ clock for charge transfer.

FIG. 5 is a more detailed schematic of a portion of the array of FIG. 3 in accordance with one embodiment of the present invention and further illustrating the endmost electrodes 20 of the parallel registers, the transfer gate electrodes 30 for the $\phi_1$ channels, the transfer electrode 32 for the $\phi_2$ channels, the storage electrode 34, the transfer electrode 36 and the storage electrode 37. The structures are similar to the semiconductor structures in U.S. Pat. No. 4,165,541, with the parallel channels defined by channel stop implant or by field oxide 40 and the doped barriers between electrodes in the parallel registers and the output serial register indicated by cross hatching 42. The transfer gates 30 and 32 are polycrystalline silicon, or polysilicon, electrodes overlying the barriers in the $\phi_1$ channels and the $\phi_2$ channels, respectively. Storage electrodes 34 are polysilicon overlying the $\phi_1$ channels between the barriers 43 and the barriers 45 and overlying the $\phi_2$ channels between the barriers 44 and the barriers 45. The charge from the storage gates 34 in the $\phi_1$ and $\phi_2$ columns can be respectively transferred through separate storage and storage gates to the serial output register 16. However, in this embodiment one storage gate 37 is used for two adjacent $\phi_1$ and $\phi_2$ columns whereby charge from the two columns are alternately transferred through the storage gate 37 to the $\phi_1$ gates of the serial output register. The transfer gates 36 have a polysilicon electrode comprising polysilicon 48 overlying the doped barrier 45 and the storage gates 37 comprises polysilicon overlying the charge storage region. The $\phi_1$ electrodes of the serial output register overlap barriers 52 between the storage gates 37 and the serial register.

Detailed operation of the SPS CCD array is illustrated in FIGS. 8-15 and will be described with reference to the timing diagram given in FIGS. 6A-6C and the electrical schematic of adjacent $\phi_1$ and $\phi_2$ columns shown in FIG. 7. As shown in FIG. 7, the endmost electrodes 20 of the two parallel columns are controlled by voltage $R_1$. The transfer gates 30 and 32 are controlled by voltages $R_A$ and $R_B$, respectively. Storage gate 34 is controlled by a voltage $R_C$, and the transfer gate 36 and storage gate 37 are controlled by a voltage $R_D$. Charge is transferred into a gate of the output serial register 16.

Referring now to FIG. 6, the $\phi_1$ and $\phi_2$ signals for transferring charge in the serial registers are given along with the ripple voltages $R_1$-$R_8$ for transferring charge in the parallel registers. The control voltages $R_A$, $R_B$, $R_C$, and $R_D$ are then shown in time sequence with respect to the $\phi_1$ and $\phi_2$ voltages and the R1-R8 ripple voltages.

Referring now to FIGS. 8-15 the transfer of charge from the parallel registers to the output serial register is illustrated at times t1-t12 (as shown in FIGS. 6A-6C). In FIG. 8 at time t1 charges are present under the endmost electrodes of the parallel registers. In FIG. 9 at times t2, t3, and t4 charges are transferred from the $\phi_1$ channels to the storage gate 34 in response to $R_B$ and $R_C$.

In FIG. 10 at time t5 the charges in the storage gates 34 are transferred through the transfer gate 36 to the storage gate 37 in response to $R_D$. In FIG. 11 charges are transferred to the output serial register from the parallel register in response to the serial register clock $\phi_1$ during the time period t6. The charges are then clocked out of the serial register beginning with time period t7, as shown in FIG. 12.

As shown in FIG. 13 at times t8, t9, and t10 while the charges in the output serial register are being clocked out, the charges in the $\phi_2$ channels of parallel registers are transferred to the storage gates 34 in response to $R_A$ and $R_C$. At time t11 the charges in the storage gates 34 are then transferred to the storage gate 37 in response to $R_D$ for loading in the serial output register 16. Finally, at time t12 the charges in the storage gate 37 are transferred into the output register 16 in response to the $\phi_1$ voltage.

By interlacing the charge at the endmost electrodes of the parallel registers and transferring the charge through shared storage gates in accordance with the invention, charge transfer timing is not critical and the use of an intermediate voltage is not required. Moreover, the structure can be used with CCD devices operating at lower voltages than presently used. Importantly, transfer to the serial shift register is obtained by the use of the serial clock $\phi_1$. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. An interface gate structure for transferring charge from the parallel to serial registers of a charge coupled device having at least first and second parallel charge transfer registers and a serial charge transfer output register comprising:
   a first transfer gate (30) for coupling charge out of said first parallel register in response to a first signal ($R_B$) at a first time;
   a second transfer gate (32) for coupling charge out of said second parallel register in response to a second output signal ($R_A$) at a second time;
   a first storage gate (34) for receiving and storing charge transferred by said first (30) and said second (32) transfer gates from said first and second parallel registers;
   a second storage gate (37) for storing charge transferred from said first storage gate (34);
   a third transfer gate (36) for transferring charge between said first storage gate (34) and said second storage gate (37) in response to a third signal ($R_D$) wherein said first transfer gate (30) and said second transfer gate (32) are offset to prevent concurrent charge transfer from said parallel registers into said first storage gate (34).

2. The interface gate structure of claim 1 further comprising a serial transfer gate ($\phi$) coupled to said second storage gate (37) for causing coupling of charge from said second storage gate (37) into said serial output register in response to a transfer signal ($\phi$) associated with the serial output register.

* * * * *